United States Patent [19]

Schinella et al.

[11] Patent Number: 5,600,182

[45] Date of Patent: Feb. 4, 1997

[54] BARRIER METAL TECHNOLOGY FOR TUNGSTEN PLUG INTERCONNECTION

[75] Inventors: Richard D. Schinella, Saratoga; Gobi R. Padmanabhan, Sunnyvale; Joseph M. Zelayeta, Saratoga, all of Calif.

[73] Assignee: LSI Logic Corporation, Milpitas, Calif.

[21] Appl. No.: 378,027

[22] Filed: Jan. 24, 1995

[51] Int. Cl.$^6$ ................................................ H01L 29/54
[52] U.S. Cl. ..................... 257/763; 428/216; 428/336; 428/457; 428/469; 428/472; 428/698; 257/741; 257/748; 257/750; 257/751; 257/758
[58] Field of Search ................................ 428/457, 469, 428/472, 698, 216, 336; 257/741, 748, 750, 751, 758, 763; 437/190, 192, 194, 195

[56] References Cited

U.S. PATENT DOCUMENTS

| | | | |
|---|---|---|---|
| 4,783,248 | 11/1988 | Kohlhase | 204/192.17 |
| 4,884,123 | 11/1989 | Dixit | 357/71 |
| 4,965,656 | 10/1990 | Koubuchi | 357/71 |
| 5,227,335 | 7/1993 | Holschwandner | 437/192 |
| 5,242,860 | 9/1993 | Nulman | 437/190 |

FOREIGN PATENT DOCUMENTS 0302538  12/1988  Japan.

*Primary Examiner*—Archene Turner
*Attorney, Agent, or Firm*—Townsend and Townsend & Crew LLP

[57] ABSTRACT

A method for producing a relatively thin titanium nitride barrier layer in an integrated circuit is presented. The titanium nitride layer may be utilized in a tungsten plug interconnection by providing a semiconductor wafer with a conducting layer covered by an insulating layer. The insulating layer is patterned and etched to form contact holes or vias. A layer of titanium is deposited on the surface of the wafer including the sidewalls and bottom of the via. A relatively thin titanium nitride layer is then formed on the titanium layer. The formation of the titanium nitride layer includes growing titanium nitride by a reaction of a nitrogen-bearing species with the titanium layer. The titanium nitride layer prevents the underlying titanium layer from reacting with the subsequent tungsten layer which is deposited on the wafer to fill the via. The tungsten layer is then etched so that the tungsten remaining forms a plug interconnection between conducting layers.

26 Claims, 10 Drawing Sheets

5,600,182

BARRIER METAL TECHNOLOGY FOR TUNGSTEN PLUG INTERCONNECTION

BACKGROUND OF THE INVENTION

The present invention is directed toward semiconductor processing technology and, in particular, to the use of titanium nitride (TiN) layers with tungsten plugs in vias to make interlayer connections.

Present-day, high-performance integrated circuits typically have multiple layers of metal conducting lines. These metal layers are separated by thick, silicon dioxide insulating layers. Vias are made through the insulating layers to make connections between the metal lines. It is often desirable that the metal conducting lines be maintained in as much of a plane as possible to avoid undue stresses on the metal lines. A tungsten metal plug is often used to fill the via, or contact hole, in the insulating layer covering a first metal line so that the overlying metal layer from which a overlying second metal line is formed remains on the planar surface of the insulating layer. Without the plug, the overlying metal layer must dip into the via to make contact with the underlying first metal line.

A layer of titanium (Ti) is typically placed in contact with the underlying first metal line to facilitate the formation of controllable low ohmic contacts. As the Ti layer is very reactive, a layer of titanium nitride (TiN) is placed in contact with the plug as a reactive barrier layer between the tungsten and the Ti layer. For example, if the underlying first metal is aluminum, a Ti layer is conventionally placed on the aluminum layer, followed by a TiN layer, and then the tungsten layer. The Ti layer also acts as a "glue" between the insulating layer and the TiN layer.

Heretofore, it has been believed that the TiN layer should be formed to a fair thickness (approaching 1000 Å and more) to act an effective barrier. The present invention is based, to the contrary, that an effective TiN barrier is created with a thin layer, 100 Å and even less. With the present invention, a TiN processing step is simplified with increased throughput and reliability of the TiN layer.

SUMMARY OF THE INVENTION

The present invention provides a method for forming a relatively thin TiN barrier layer to passivate an underlying Ti layer. The formation of the TiN layer includes the growing of TiN by the reaction of a nitrogen-bearing species with the underlying Ti layer. The TiN barrier layers of the present invention have a higher integrity than the relatively thick deposited TiN layers presently known. This results in higher yield and higher reliability. Furthermore, the process of the present invention is cleaner, faster and less expensive than presently known methods.

In one embodiment of the present invention, the TiN layer is formed in a tungsten plug interconnection. A semiconductor wafer is provided having a lower conducting layer covered by an insulating layer that has been patterned and etched with vias. A Ti layer is deposited within the via or over the surface of the insulating layer. A relatively thin, high integrity TiN layer is formed on the Ti layer. The formation of the TiN layer includes growing TiN by a reaction of a nitrogen-bearing species with the Ti layer. The nitrogen-bearing species can be introduced into a plasma used to sputter TiN films during a TiN sputtering process. A tungsten (W) plug is formed in the via by the decomposition of tungsten-hexafluoride ($WF_6$) in a thermal reactor. The tungsten layer or film is then plasma-etched to remove tungsten from the entire surface of the wafer except the vias, thereby forming a tungsten plug interconnection.

In another embodiment of the present invention, the TiN layer is formed in a tungsten plug of a different construction. A semiconductor wafer is provided having a lower conducting layer covered by a Ti layer. An insulating layer that has been patterned and etched with vias is formed over the Ti layer. The Ti layer is exposed at the bottom of the vias. A relatively thin, high integrity TiN layer is formed on the exposed Ti layer according to the present invention with or without the prior deposition of another Ti layer by sputtering. A tungsten plug is formed by depositing tungsten in the via and etching to remove tungsten tungsten from the entire surface of the wafer except the vias, thereby forming a tungsten plug interconnection.

A further understanding of the nature and advantages of the present invention may be realized by reference to the remaining portions of the specification and the drawings.

DESCRIPTION OF THE PREFERRED EMBODIMENT

The present invention provides a method for forming a relatively thin, high integrity titanium nitride barrier layer. The following paragraphs describe titanium nitride barrier layers of the prior art and according to the present invention in reference to tungsten plug interconnections in integrated circuits. However, these descriptions should not be taken to limit the present invention to tungsten plug interconnections.

Tungsten Plugs According to the Prior Art

Figure 1A:
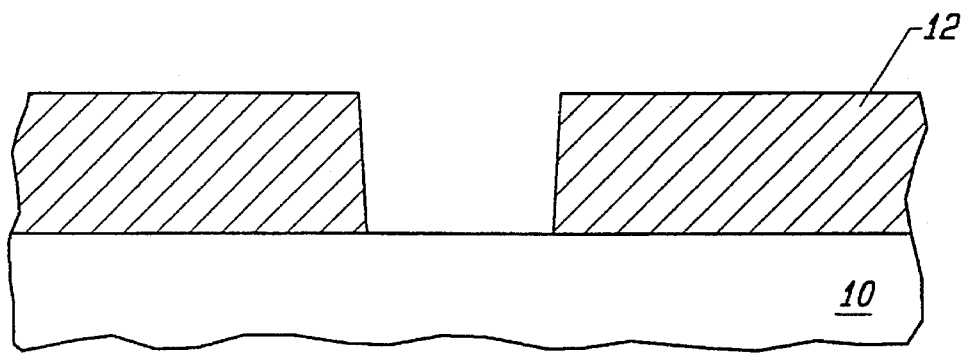
FIGS. 1A–1E are cross-sectional views of the various steps in a prior art method for making a tungsten plug interconnection in an integrated circuit.
Figure 1B:
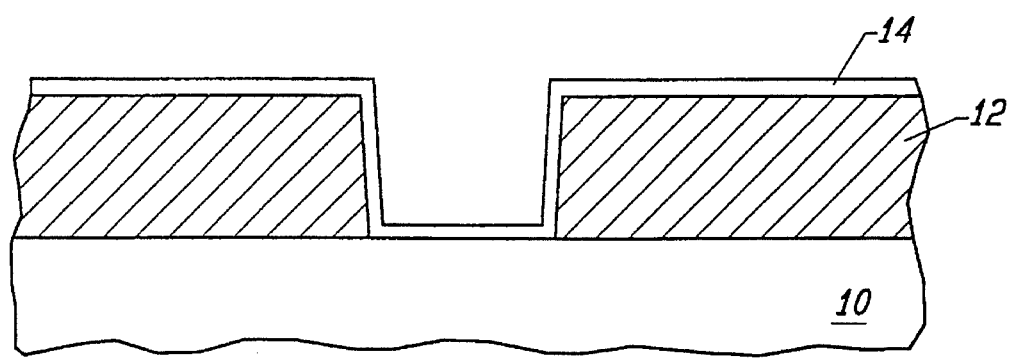
Figure 1C:
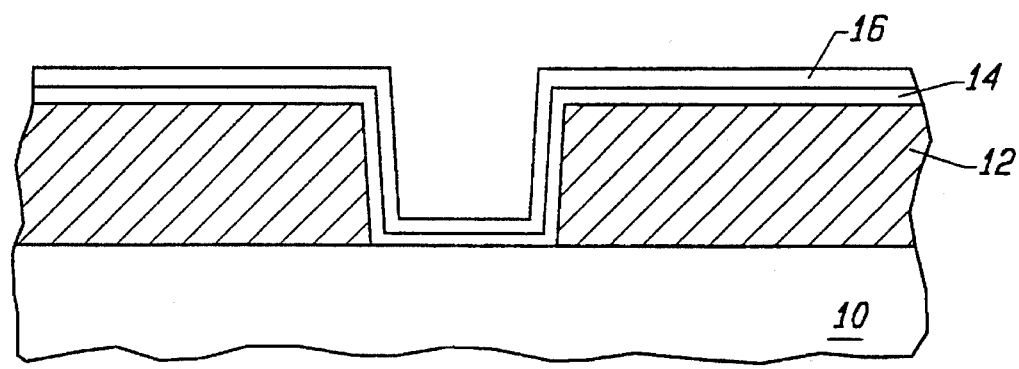
Figure 1D:
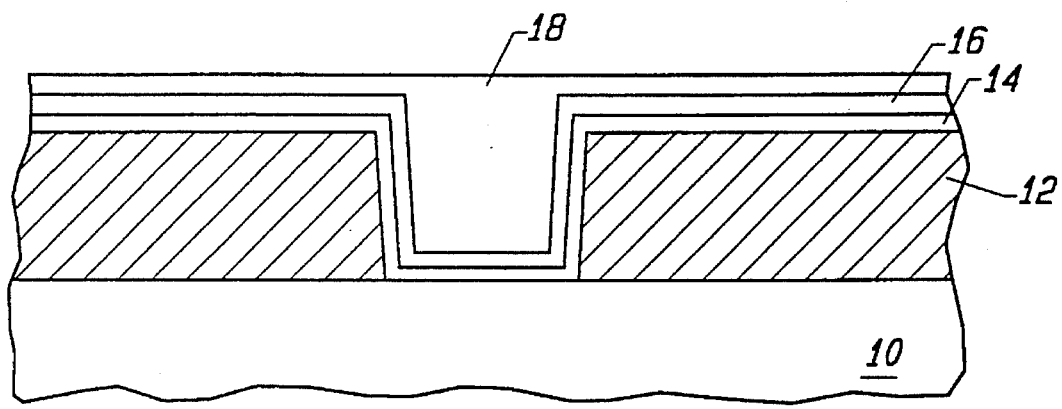
Figure 1E:
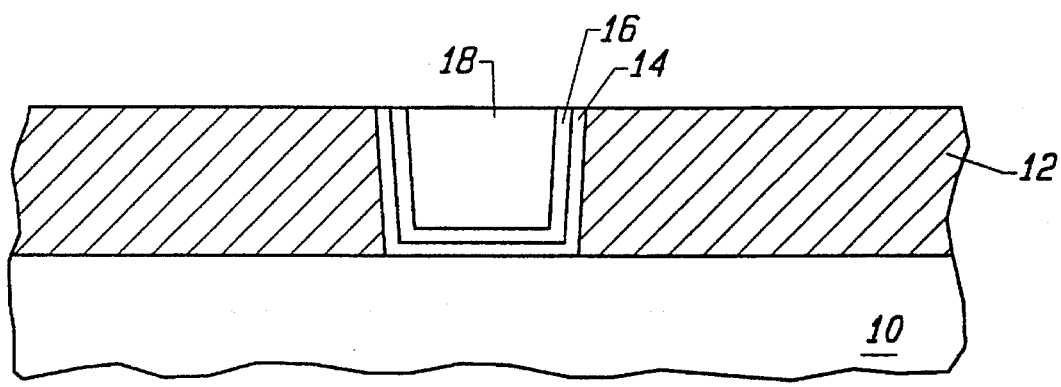

A known process for forming tungsten plugs is shown in FIGS. 1A–1E. A semiconductor wafer is provided having a lower metal conducting layer 10 covered by an insulating layer 12, as shown in FIG. 1A. The insulating layer has been patterned and etched with vias. A layer of titanium 14 of approximately 700 Angstroms thick is first deposited over the wafer surface, as shown in FIG. 1B. The titanium deposition is followed by the deposition of a layer of titanium nitride 16 approximately 700 to 1100 Angstroms thick, as shown in FIG. 1C. These two films coat the entire wafer surface, with various degrees of conformance over sidewalls and bottoms of the vias. In FIG. 1D, a layer of tungsten 18 is deposited to fill the via by the decomposition of tungsten-hexafluoride ($WF_6$) in a thermal reactor. The tungsten film is then plasma-etched to remove tungsten from the entire surface of the wafer except the vias, thereby forming a tungsten plug interconnection, as shown in FIG. 1E.

Titanium nitride layer 16 is used as a barrier layer to prevent the tungsten-hexafluoride from reacting with titanium layer 14. Titanium layer 14 is generally used as a "glue" layer between the insulating layer and titanium nitride layer 16. The titanium layer also facilitates the formation of controllable and low ohmic contacts to the underlying metal conducting layer.

Figure 2A:
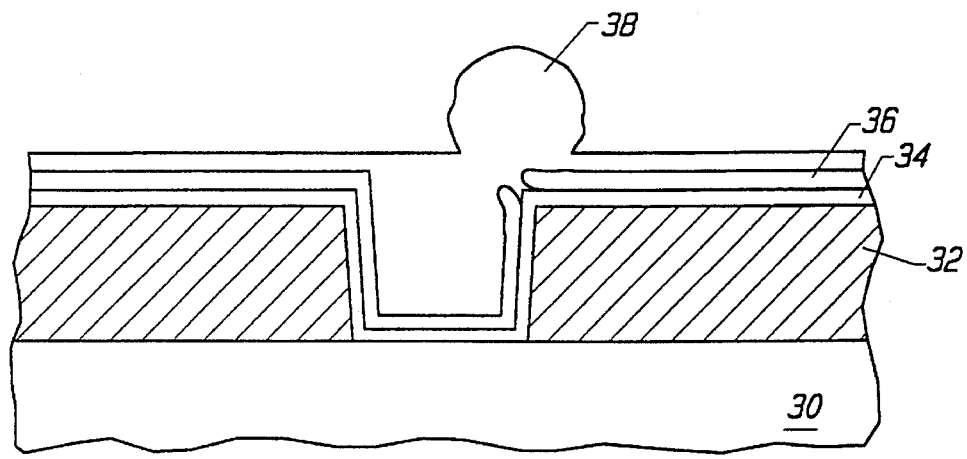
FIGS. 2A–2C are cross-sectional views showing a tungsten growth defects occurring in prior art methods.

However, a tungsten defect, and subsequent tungsten growth, can result from the reaction of tungsten-hexafluoride with titanium through a failure in the barrier properties of the titanium nitride layer or film. In FIG. 2A, an aluminum conducting layer 30 is covered by an insulating layer 32, a deposited titanium layer 34, and a deposited titanium nitride layer 36. The titanium nitride layer may break at the step because it is highly stressed which results in a tungsten growth 38 during the tungsten deposition. The tungsten growths are generally larger than the thickness of the tungsten layer and are not effectively removed or planarized during the tungsten etchback process for plug formation. Consequently, these growths can act as electrical bridges between metal lines in a given conducting layer or plane and/or as shorts between different conducting layers. Additionally, the tungsten growths can cause non-planarization of subsequently deposited layers, which adversely effects lithography performed on the layers.

Figure 2B:
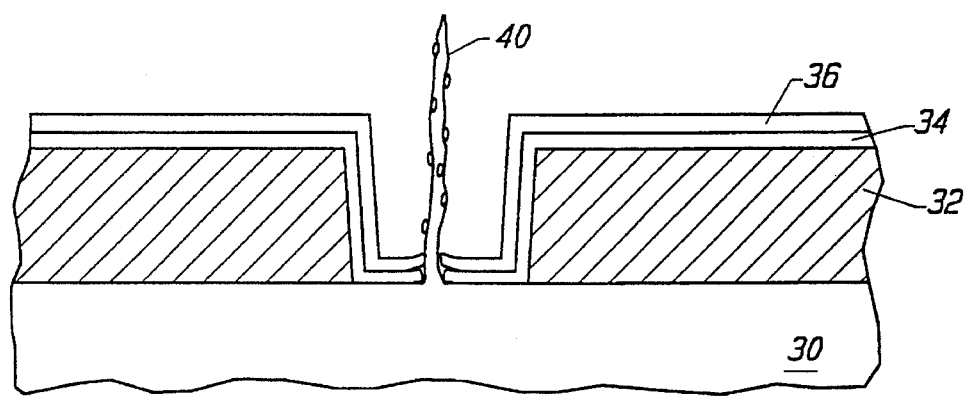
Figure 2C:
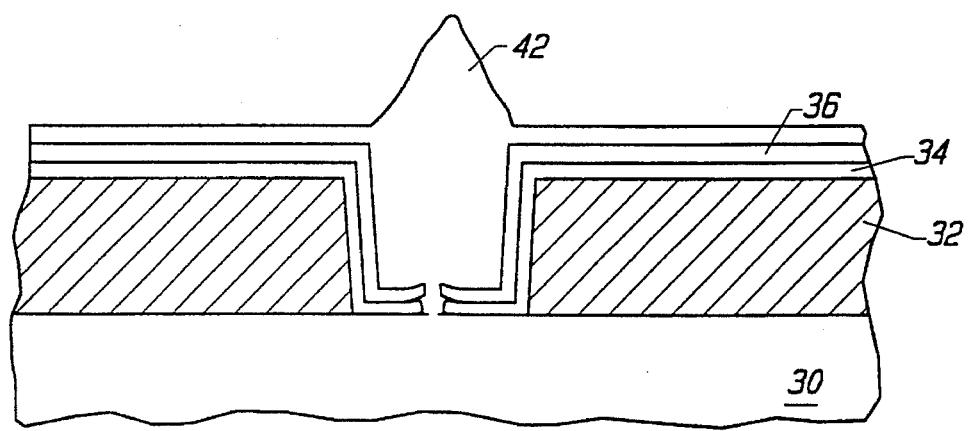

Another defect can result from the reaction of tungsten-hexafluoride with exposed titanium as shown in FIGS. 2B–2C. At the bottom of the via as shown in FIG. 2B, titanium layer 34 may react with aluminum layer 30 to form titanium-trialuminum ($TiAl_3$). This reaction is a volume expansive reaction which increases the compressive stresses on the aluminum conducting layer causing an enhancement of the grain-boundary diffusion of aluminum. As a result, the highly mobile aluminum molecules may be forced through a defect in both the titanium and titanium nitride films before or during tungsten deposition. As the aluminum proceeds through the defect, forming an aluminum "whisker" 40, titanium molecules may be carried along with the diffusing aluminum. During the tungsten layer deposition process shown in FIG. 2C, tungsten-hexafluoride reacts with the exposed titanium molecules to form a very large tungsten defect 42.

These tungsten defects result in reduced product yields and reduced device reliability. One method known in the industry for reducing the tungsten defects described above is to increase the thickness of the deposited titanium nitride layer (approaching 1000 Angstroms or more). However, as the thickness of the titanium nitride increases, the cost and time to perform the process also increases. The present invention utilizes a relatively thin titanium nitride layer which has not heretofore been attempted because of the belief that a relatively thin titanium nitride layer would not passivate the highly reactive titanium layer.

Tungsten Plugs According to the Present Invention

FIGS. 3A–3E illustrate a process for making a tungsten plug interconnection according to the present invention. In the initial step shown in FIG. 3A, a conducting layer 50 is formed on a semiconductor wafer (not shown) with a covering insulating layer 52. The insulating layer is a dielectric material, typically silicon dioxide with a typical thickness normally in a range from 5000 to 15,000 Angstroms formed by chemical vapor deposition (CVD). Preferably, the wafer is then subjected to an annealing process, which may help to reduce the number of tungsten defects due to a relaxation of stresses in the underlying metal conducting layer to a degree sufficient to render the subsequently occurring increases in compressive stress and thermal agitation inadequate to drive "hillock" or "whisker" growth.

A contact hole or via 54 is then formed by standard photolithographic and etching techniques in insulating layer 52 where it is desired to make an interconnection with the underlying conducting layer. Preferably, the photoresist used to pattern the vias is treated with a 230° C. deep ultraviolet (UV) hardbake process which may help reduce the number of tungsten defects because of reduced polymer contamination in via 54 after etch, and/or relaxation of stresses in the underlying conducting layer due to grain boundary/grain size modification.

Figure 3A:
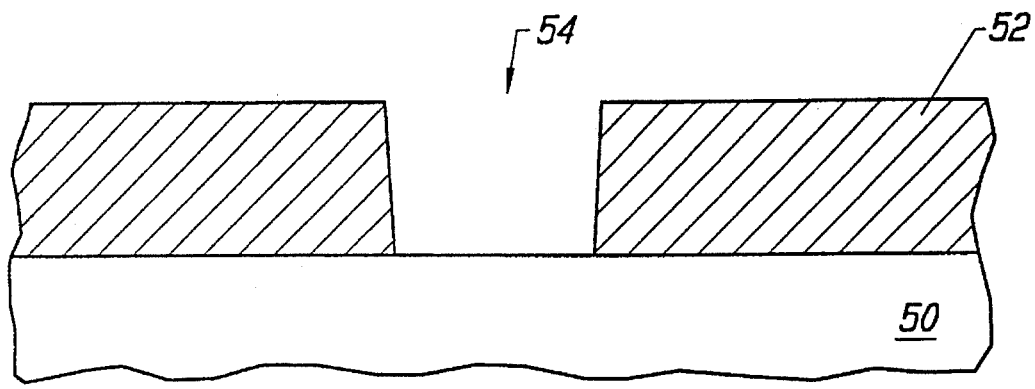
FIGS. 3A–3E are cross-sectional views of the various steps in a method for making a tungsten plug interconnection according to the present invention.
Figure 3B:
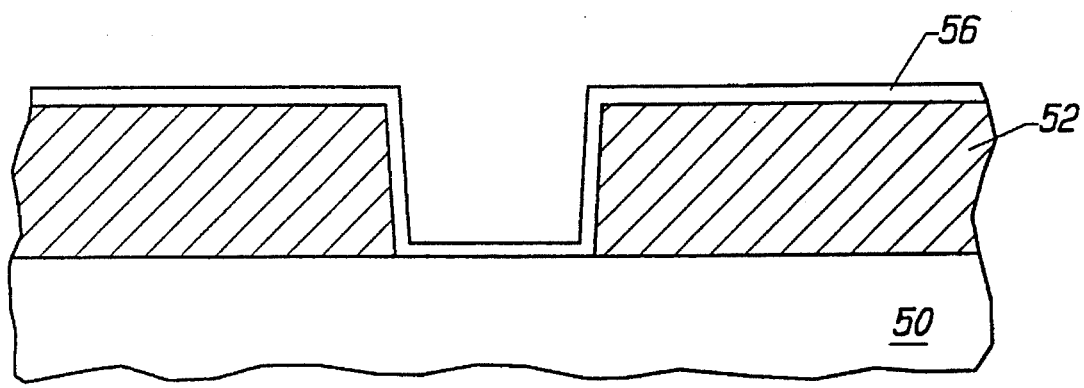

The insulating layer 52 is then covered by a titanium layer 56, as shown in FIG. 3B, by sputtering. The titanium layer coats the entire wafer surface with various degrees of conformance over the sidewalls and bottom of via 54. Typically the titanium layer has a thickness of approximately 50 to 700 Angstroms at the upper surface and 100 Angstroms may be optimal.

Figure 3C:
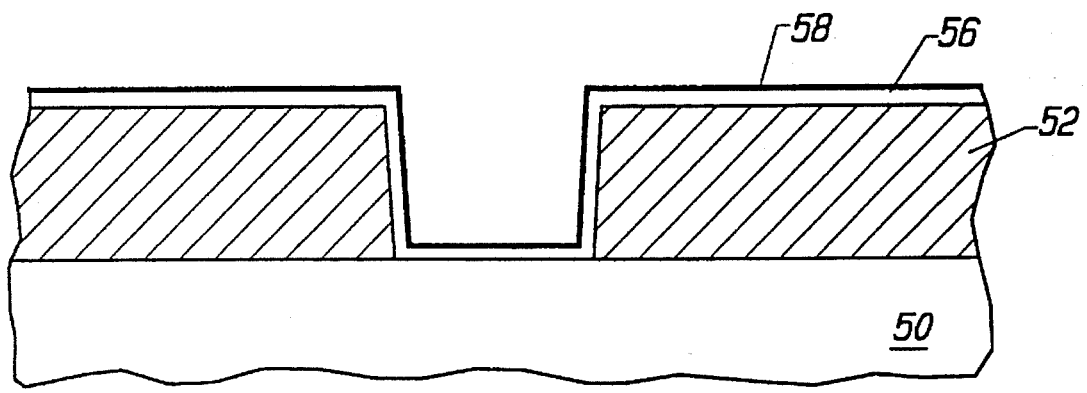

Then a titanium nitride layer 58 is formed by sputtering a relatively thin layer of titanium nitride on the wafer, as shown in FIG. 3C. The sputtered titanium nitride layer may be in the range of 50 to 200 Angstroms thick on the upper surface of the wafer and 100 Angstroms may be optimal. Preferably, the wafer is not exposed to atmospheric contamination between the titanium and titanium nitride deposition steps. During the sputtering process, nitrogen-bearing species react with the titanium layer to grow titanium nitride either initially or through voids in the thin deposited titanium nitride layer. The relatively thin layer of deposited titanium nitride has reduced stress over thicker films because the additional thickness adds to the stress. The combination of the reduced stress titanium nitride layer and the grown titanium nitride produces a titanium nitride barrier layer with higher integrity.

Additionally, the flux of sputtered titanium nitride decreases toward the bottom of the via. There may be approximately a 9:1 difference between the thickness of sputtered titanium nitride on the upper surface as compared to the bottom of the via. Thus, the sputtered titanium nitride at the bottom of the via may be 10 Angstroms or less. It is believed that the titanium nitride layer on the bottom of the via is primarily caused by the reaction of a nitrogen-bearing species with the titanium layer, thereby forming a grown titanium nitride layer. The nitrogen-bearing species being present in the plasma normally used for the sputtering of TiN from a titanium or titanium nitride target. The grown titanium nitride layer at the bottom of the via may be in the range of 20 to 50 Angstroms thick and 40 Angstroms may be optimal.

Figure 6:
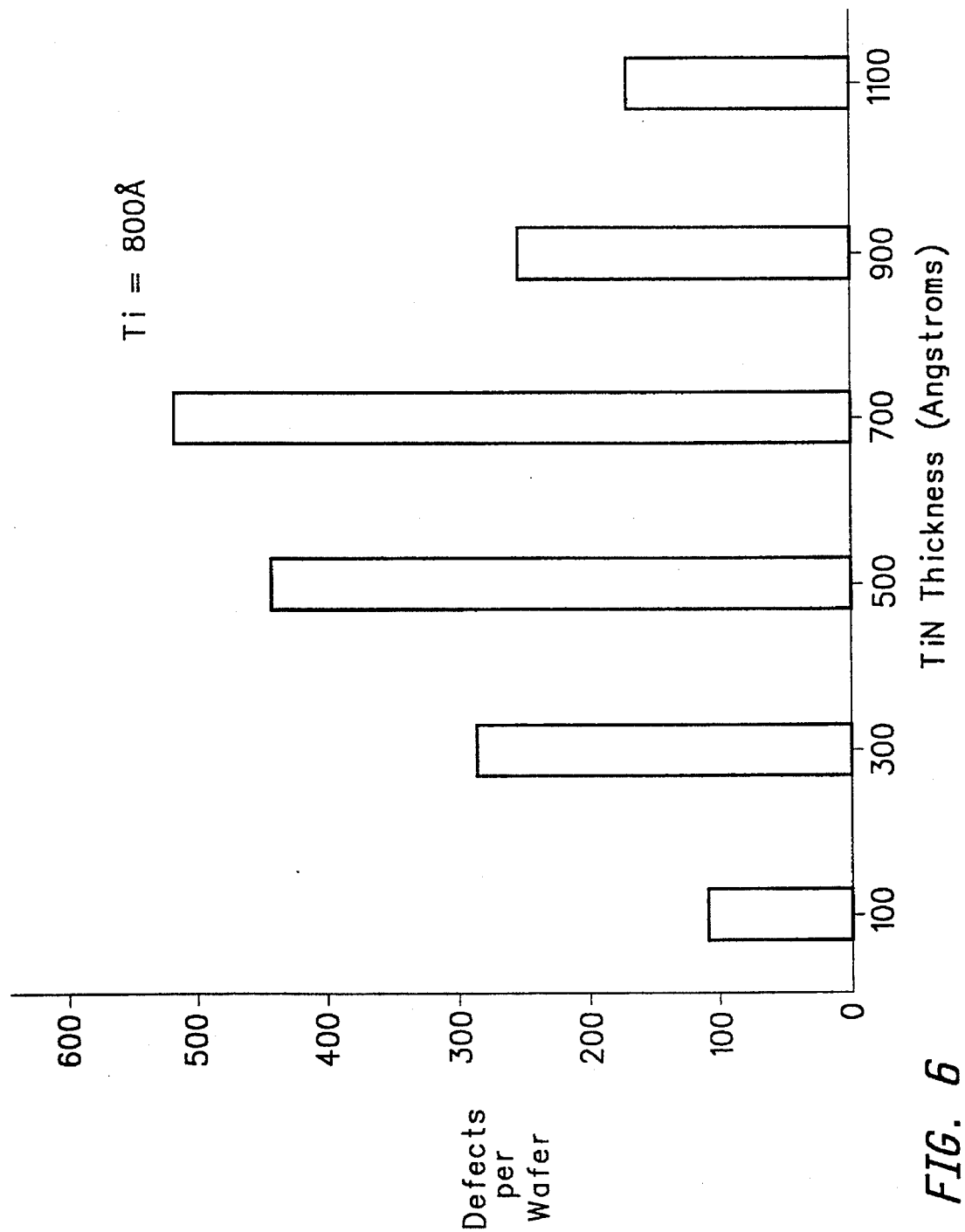
FIG. 6 is a bar graph of the defects per wafer vs. TiN thickness in a semiconductor wafer having tungsten plug interconnections.

FIG. 6 is a bar graph that shows the relationship between the number of defects per wafer and the titanium nitride thickness in a tungsten plug interconnection made according to the present invention. Semiconductor wafers with etched vias were covered by a titanium layer of approximately 800 Angstroms thick. Titanium nitride layers with varying thicknesses were then formed on different wafers and the number of tungsten defects per wafer were counted for each titanium nitride thickness. FIG. 6 shows that the number of defects is reduced when the titanium nitride thickness is reduced to approximately 100 Angstroms. The defects in the wafers include both of the tungsten defects described earlier in reference to FIGS. 2A–2C.

When the thickness of the sputtered titanium nitride layer on the upper surface of the wafer is reduced (e.g. below 700

Angstroms), as suggested by the present invention, it should be noted that good ohmic contact characteristics with the underlying conducting layer are achieved if the thickness of the titanium layer on the upper surface of the wafer is also reduced. This may be because the stresses in the titanium and titanium nitride layers balance each other. Preferably, the titanium layer is substantially equal to the thickness of the titanium nitride layer on the upper surface of the wafer. Good ohmic contact characteristics are achieved with a titanium layer on the upper surface of 200 to 400 Angstroms and 300 Angstroms may be optimal. It is believed that this results in a titanium layer at the bottom of the via from 30 to 50 Angstroms thick.

Alternatively, it is believed that an effective titanium nitride layer 58 may be grown on the titanium layer without the simultaneous sputtering or deposition of titanium nitride. The titanium nitride layer is grown by the reaction of a nitrogen-bearing species, such as ammonia, with the surface of the titanium layer. One method for forming the titanium nitride layer includes rapid thermal nitration (RTN) techniques in a cluster tool application. Preferably, the titanium nitride layer is grown without removing the wafer from the vacuum environment utilized to deposit the titanium layer. The grown titanium nitride layer may be in the range of 20 to 50 Angstroms thick to passivate the underlying titanium layer. A titanium nitride layer of 40 Angstroms may be optimal.

Figure 3D:
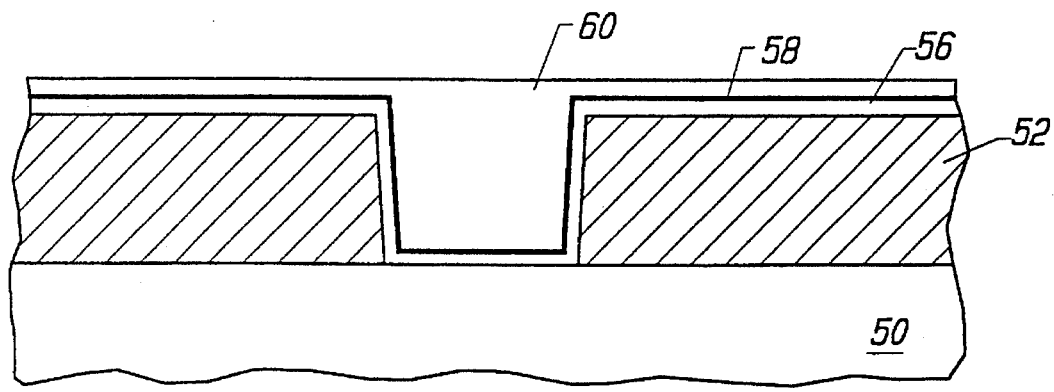

In FIG. 3D, a conformal tungsten coating is deposited from the decomposition of $WF_6$ in a thermal reactor forming a tungsten film 60. The tungsten film may be comprised of several layers deposited using different process parameters. The thickness of the tungsten film is such that the height of the tungsten in the via is above the plane of the upper surface of the desired via opening. Preferably, the tungsten film is deposited at a lower temperature of 450° C. which may help reduce the number of tungsten defects because of a reduced tendency of the conducting layer to form intermetallic compounds, such as $TiAl_3$, with the titanium layer and/or a reduced ability of $WF_6$ to diffuse through defects to the underlying titanium layer.

Figure 3E:
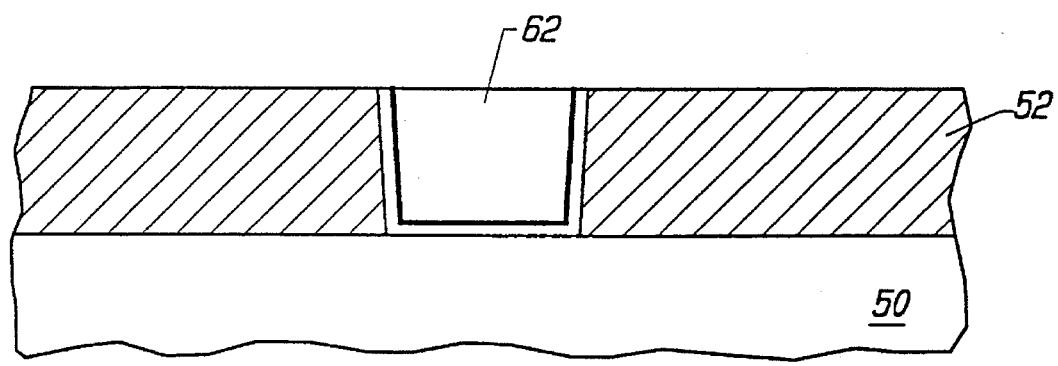

The tungsten film is then plasma-etched to remove tungsten from the entire surface of the wafer except the via openings to form a tungsten plug 62 as shown in FIG. 3E. Alternatively, the tungsten etchback process may be stopped at upper surface of the titanium nitride layer or the titanium layer. After the tungsten etchback process, a second conducting layer can be deposited that electrically contacts the tungsten plug. The tungsten layer can alternatively be removed from the wafer surface by use of a chemo-mechanical polish (CMP) process.

FIGS. 4A–4D illustrate another process for making a tungsten plug interconnection according to the present invention. In the initial step shown in FIG. 4A, a conducting layer 70 formed on a semiconductor wafer (not shown) is covered by a titanium layer 72 and a titanium nitride layer 74. Although titanium layer 72 is shown covered by titanium nitride layer 74, it is only important that the titanium layer be exposed after the subsequent via etch process.

An insulating layer 76 covers titanium nitride layer 74. Typically the insulating layer is silicon dioxide deposited by chemical vapor deposition (CVD). A contact hole or via is then formed by standard photolithographic and etching techniques in insulating layer 76 where it is desired to make an interconnection with the underlying conducting layer. The etching process etches away the titanium nitride layer at the bottom of the via exposing the titanium layer.

Figure 4A:
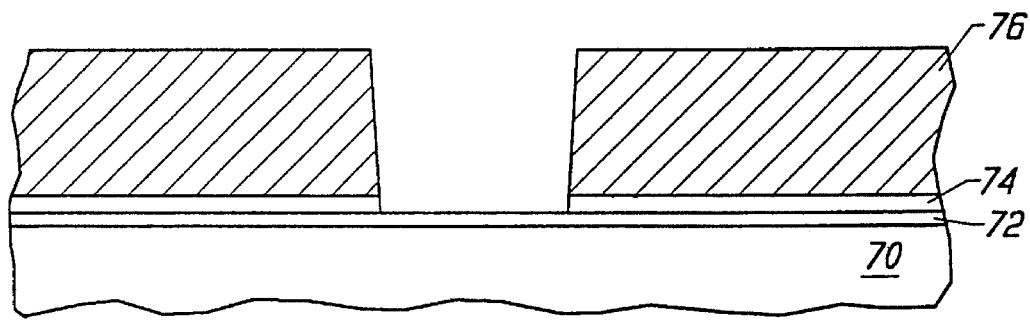
FIGS. 4A–4D are cross-sectional views of the various steps in another method for making a tungsten plug interconnection according to the present invention.
Figure 4B:
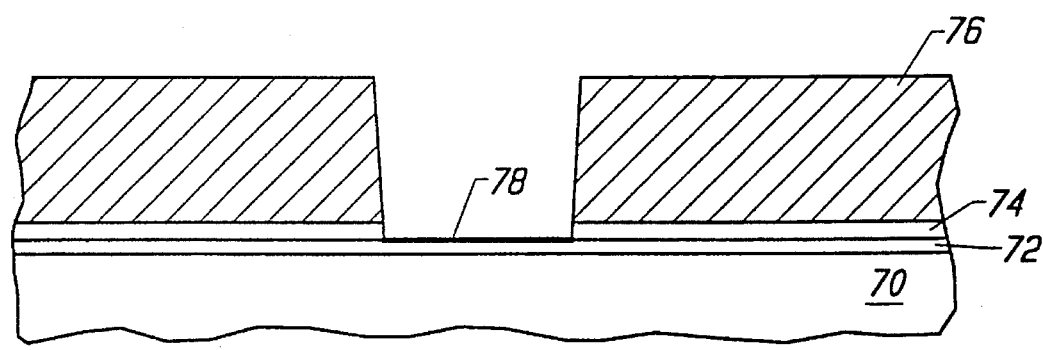

Then a relatively thin titanium nitride layer 78 is formed on the exposed titanium layer, as shown in FIG. 4B. The formation of the titanium nitride layer includes the growing of titanium nitride by the reaction of a nitrogen-bearing species with the surface of the titanium layer. The underlying titanium layer may be substantially consumed by the formation of the titanium nitride layer so that, advantageously, an inadequate amount of titanium remains to react with the tungsten-hexafluoride to form tungsten defects of significance in the event of TiN barrier failure.

Figure 4C:
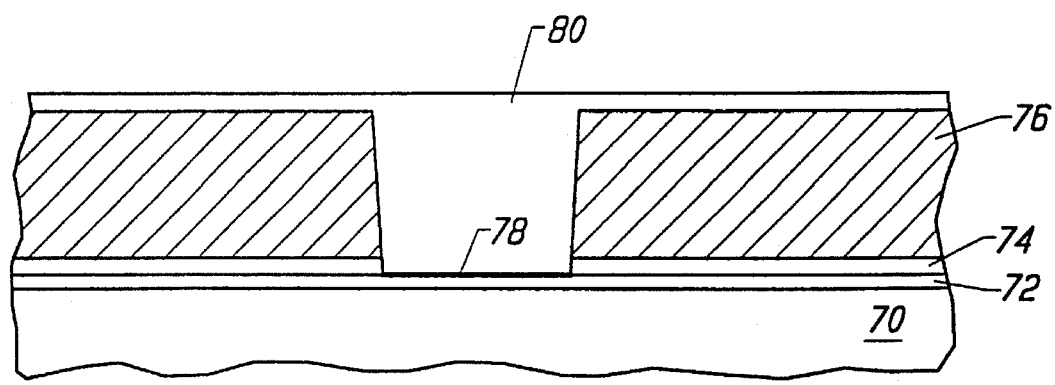
Figure 4D:
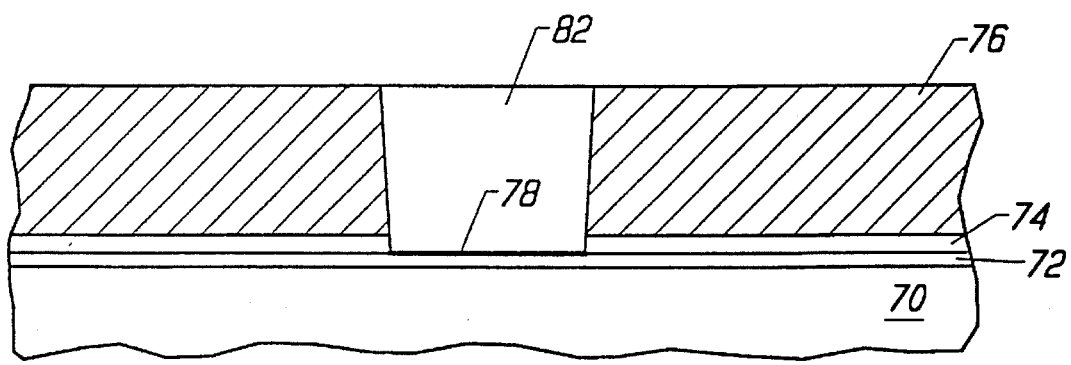

In FIG. 4C, a conformal tungsten coating is deposited from the decomposition of $WF_6$ in a thermal reactor forming a tungsten film 80. As described earlier, the thickness of the tungsten film is such that the height of the tungsten in the via is above the plane of the upper surface of the desired via opening. After the tungsten etchback process to form a tungsten plug 82 as shown in FIG. 4D, a second conducting layer can be deposited that electrically contacts the tungsten plug. A tungsten plug interconnection formed in this manner has adequate titanium in the via region resulting in acceptable quality ohmic contacts with the underlying conducting layer.

FIGS. 5A–5E illustrate yet another process for making a tungsten plug interconnection according to the present invention. In the initial step shown in FIG. 5A, a conducting layer 90 formed on a semiconductor wafer (not shown) is covered by a titanium layer 92 and a titanium nitride layer 94.

An insulating layer 96 covers titanium nitride layer 94. Typically the insulating layer is silicon dioxide deposited by chemical vapor deposition (CVD). A contact hole or via is then formed by standard photolithographic and etching techniques in insulating layer 96 where it is desired to make an interconnection with the underlying conducting layer. The etching process etches away the titanium nitride layer at the bottom of the via exposing the titanium layer.

Figure 5A:
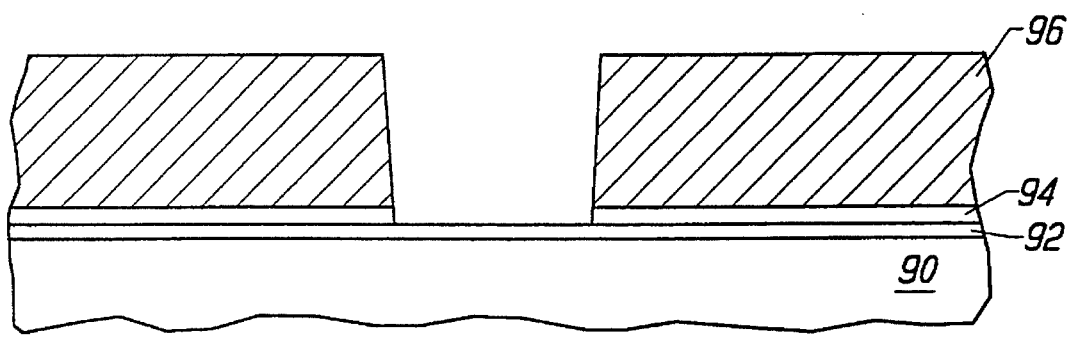
FIGS. 5A–5E are cross-sectional views of the various steps in yet another method for making a tungsten plug interconnection according to the present invention.
Figure 5B:
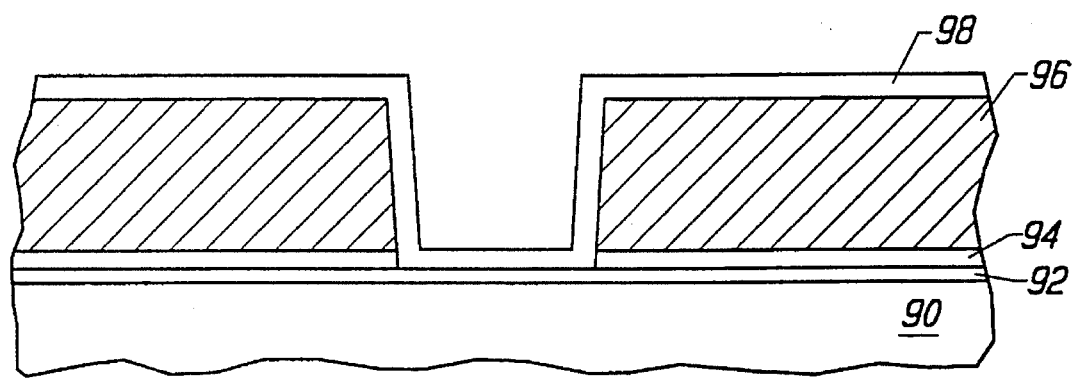
Figure 5C:
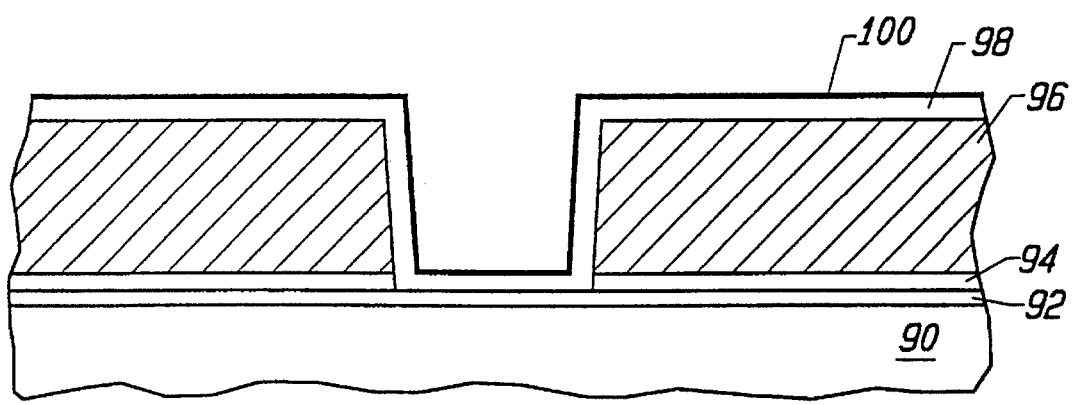

Then a titanium layer 98 is deposited over the wafer, as shown in FIG. 5B. Titanium layer 98 contacts the exposed portion of titanium layer 92 at the bottom of the via. In FIG. 5C, a relatively thin titanium nitride layer 100 is formed on titanium layer 98. The formation of the titanium nitride layer includes the growing of titanium nitride by the reaction of a nitrogen-bearing species with the surface of titanium layer 98.

Figure 5D:
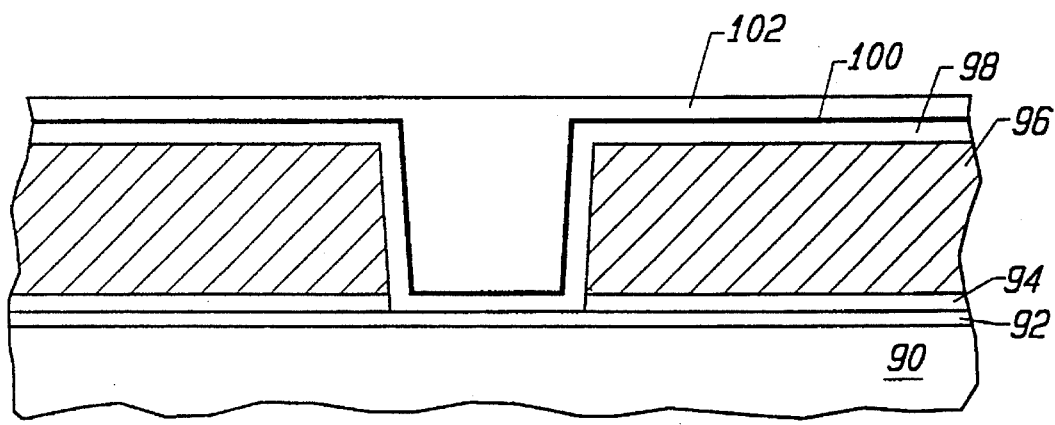
Figure 5E:
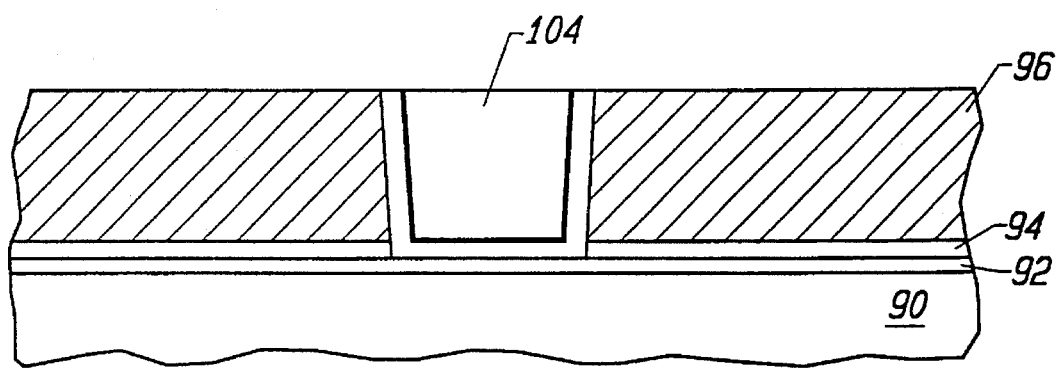

A conformal tungsten coating is deposited from the decomposition of $WF_6$ in a thermal reactor forming a tungsten film 102, as shown in FIG. 5D. A tungsten plug 104 is formed by an etchback process, as shown in FIG. 5E.

While the above is a complete description of specific embodiments of the invention, various modifications, alternative constructions, and equivalents may be used. Therefore, the above description should not be taken as limiting the scope of the invention as defined by the following claims.

What is claimed is:

1. An integrated circuit device, comprising:

a first conducting layer having a top surface;

a titanium layer on said first conducting layer, said titanium layer having a top surface;

a titanium nitride layer in a range of 20 to 50 Angstroms thick on said titanium layer; and a second conducting layer on said titanium nitride layer.

2. The integrated circuit device of claim 1, wherein said titanium nitride layer is approximately 40 Angstroms thick.

3. The integrated circuit device of claim 1, wherein said titanium layer is in a range of 30 to 50 Angstroms thick.

4. The integrated circuit device of claim 1, wherein said titanium nitride layer is grown by a reaction of a nitrogen-bearing species with said titanium layer.

5. The integrated circuit of claim 1, wherein said titanium layer and said titanium nitride layer have a same thickness.

6. The integrated circuit device of claim 1, further comprising an insulating layer over said first conducting layer, said insulating layer having an opening to said top surface of said first conducting layer, said opening having side and bottom surfaces, and said titanium layer is located on said side and bottom surfaces of said opening.

7. The integrated circuit device of claim 1, further comprising an insulating layer over said titanium layer, said insulating layer having an opening to said top surface of said titanium layer, said opening having side and bottom surfaces, and said titanium nitride layer is located on said titanium layer on said bottom surface of said opening.

8. The integrated circuit of claim 1, wherein said titanium nitride layer is a single layer.

9. An interconnection in an integrated circuit device, said integrated circuit device formed within and on a semiconductor substrate, said interconnection comprising:

a first conducting layer having a top surface;

an insulating layer on said first conducting layer, said insulating layer having a top surface and an opening having side and bottom surfaces;

a titanium layer on said first conducting layer at said bottom surface of said opening;

a titanium nitride layer in a range of 20 to 50 Angstroms thick on said titanium layer; and a second conducting layer in said opening on said titanium nitride layer.

10. The interconnection of claim 9, wherein said titanium nitride layer is approximately 40 Angstroms thick.

11. The interconnection of claim 9, wherein said titanium layer is in a range of 30 to 50 Angstroms thick.

12. The interconnection of claim 9, wherein said titanium nitride layer is grown by a reaction of a nitrogen-bearing species with said titanium layer.

13. The interconnection of claim 9, wherein said titanium layer and said titanium nitride layer have a same thickness.

14. The interconnection of claim 9, wherein said titanium layer is on said top surface of said insulating layer.

15. The interconnection of claim 9, wherein said second conducting layer is tungsten.

16. The interconnection of claim 9, wherein said titanium nitride layer is a single layer.

17. The interconnection of claim 9, wherein said titanium layer is in a range of 30 to 700 Angstroms thick.

18. An interconnection in an integrated circuit device, said integrated circuit device formed within and on a semiconductor substrate, said interconnection comprising:

a first conducting layer having a top surface;

an insulating layer on said first conducting layer, said insulating layer having a top surface and an opening having side and bottom surfaces;

a titanium layer on said side and bottom surfaces of said opening;

a titanium nitride layer in a range of 20 to 200 Angstroms thick on said titanium layer; and a second conducting layer in said opening on said titanium nitride layer.

19. The interconnection of claim 18, wherein said titanium nitride layer is approximately 40 Angstroms thick.

20. The interconnection of claim 18, wherein said titanium nitride layer is approximately 100 Angstroms thick.

21. The interconnection of claim 17, wherein said titanium layer is approximately 100 Angstroms thick.

22. The interconnection of claim 18, wherein said titanium nitride layer is grown by a reaction of a nitrogen-bearing species with said titanium layer.

23. The interconnection of claim 18, wherein said titanium layer and said titanium nitride layer have a same thickness.

24. The interconnection of claim 18, wherein said titanium layer is on said top surface of said insulating layer.

25. The interconnection of claim 18, wherein said second conducting layer is tungsten.

26. The interconnection of claim 18, wherein said titanium nitride layer is a single layer.

\* \* \* \* \*